(12) United States Patent
Orchard-Webb

(10) Patent No.: US 6,355,958 B1
(45) Date of Patent: Mar. 12, 2002

(54) SPARK GAP FOR HERMETICALLY PACKAGED INTEGRATED CIRCUITS

(75) Inventor: Jonathan Harry Orchard-Webb, Wales (GB)

(73) Assignee: Mitel Corporation, Kanata (CA)

( * ) Notice: Subject to any disclaimer, the term of this patent is extended or adjusted under 35 U.S.C. 154(b) by 0 days.

(21) Appl. No.: 09/246,841

(22) Filed: Feb. 9, 1999

(30) Foreign Application Priority Data

Feb. 20, 1998 (GB) .............................................. 9803482

(51) Int. Cl.$^7$ ................................................ H01L 23/62
(52) U.S. Cl. ........................ 257/355; 257/358; 257/379; 361/56; 361/117
(58) Field of Search ................................ 257/522, 355, 257/356, 358, 379, 363; 361/117, 56, 256, 257, 118; 313/250, 268, 498, 131 A

(56) References Cited

U.S. PATENT DOCUMENTS

| | | | | |
|---|---|---|---|---|
| 3,676,742 A | * | 7/1972 | Russell et al. ................. | 361/56 |
| 4,295,176 A | * | 10/1981 | Wittwer ........................ | 361/91 |
| 4,504,766 A | * | 3/1985 | Kaneko ....................... | 313/634 |
| 4,586,105 A | * | 4/1986 | Lippmann et al. ........... | 361/117 |
| 4,794,437 A | * | 12/1988 | Palumbo ..................... | 361/118 |
| 4,809,044 A | * | 2/1989 | Pryor et al. .................... | 257/3 |
| 5,436,183 A | * | 7/1995 | Davis et al. ................. | 438/200 |
| 5,610,790 A | * | 3/1997 | Staab et al. .................... | 361/56 |
| 5,656,530 A | * | 8/1997 | Leary .......................... | 438/639 |
| 5,811,330 A | * | 9/1998 | Kalnitsky .................... | 438/238 |
| 5,933,307 A | * | 8/1999 | West ............................ | 361/56 |
| 5,992,326 A | * | 11/1999 | Martinez-Tovar et al. ............. | 102/202.4 |
| 6,215,251 B1 | * | 4/2001 | Orchard-Webb ....... | 315/209 M |
| 5,786,613 A1 | * | 6/2001 | Geissler et al. ............. | 257/355 |
| 6,245,600 B1 | * | 6/2001 | Geissler et al. ............. | 438/149 |

FOREIGN PATENT DOCUMENTS

| | | | |
|---|---|---|---|
| DE | 25 08 183 A | 9/1976 | |
| DE | 38 29 650 A | 3/1990 | |
| EP | 0 785 708 A | 7/1997 | |
| EP | 0 790 758 A | 8/1997 | |
| EP | 790758 | 8/1997 | |
| GB | 2 049 299 A | * 12/1980 | ............. H01T/1/00 |
| GB | 2 286 923 A | * 8/1995 | ........... H01L/23/60 |
| JP | 07122568 | 5/1995 | |

* cited by examiner

Primary Examiner—Jerome Jackson, Jr.
Assistant Examiner—JoséR Diaz
(74) Attorney, Agent, or Firm—Lawrence E. Laubscher, Jr.

(57) ABSTRACT

A method and assembly for a spark gap. A plurality of resistors are positioned adjacent the spark gap for reducing the energy in the gap during electrostatic discharge.

9 Claims, 1 Drawing Sheet

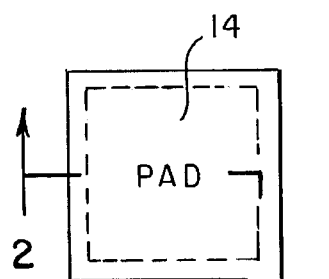
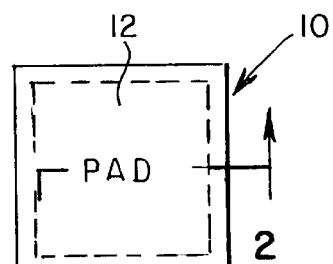
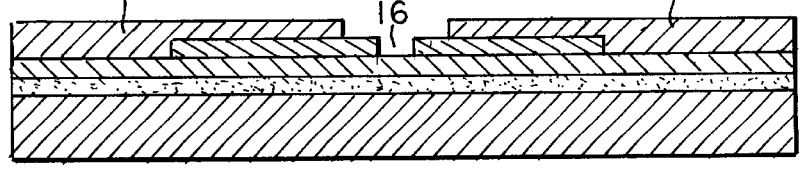
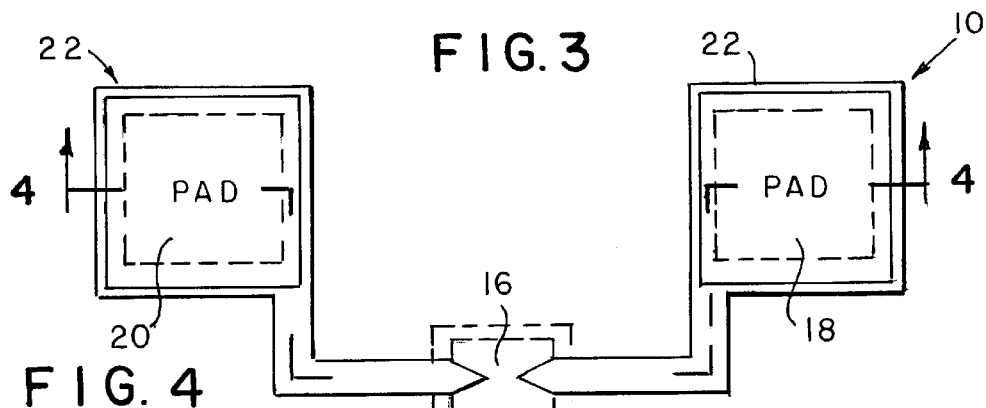
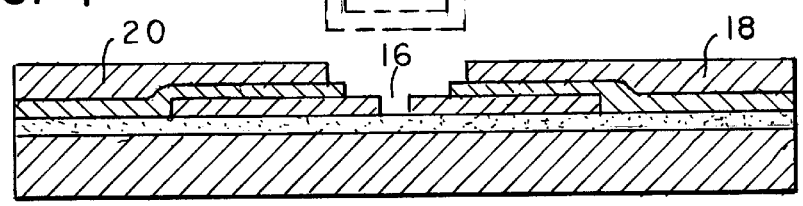
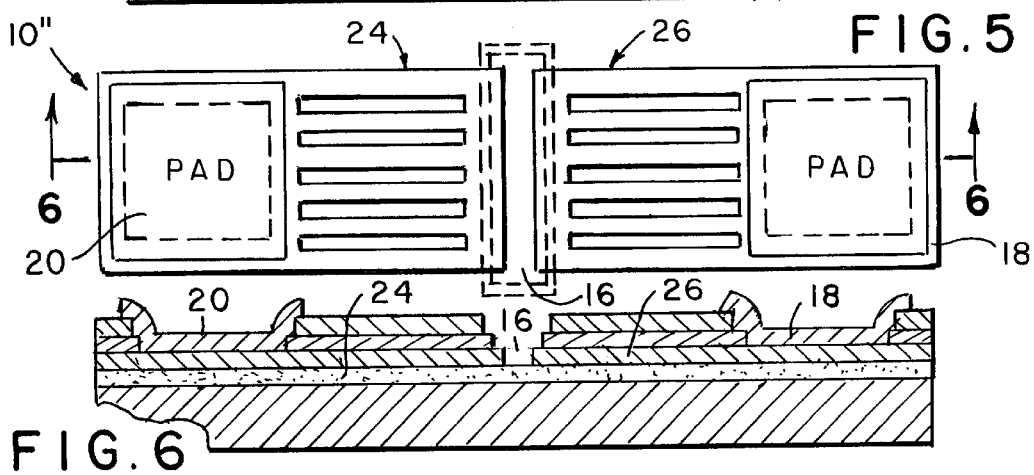

SPARK GAP FOR HERMETICALLY PACKAGED INTEGRATED CIRCUITS

FIELD OF THE INVENTION

The present invention is directed to a spark gap and more particularly the present invention is directed to a spark gap having enhanced thermal dissipation for the prevention of open circuit formation in high voltage applications.

BACKGROUND OF THE INVENTION

Silicon integrated circuits are moving inexorably to finer geometries and higher frequencies, use of these circuits is also expanding into new areas requiring improved performance. One of the most important of these new areas is high voltage.

In the art presently, a problem exists, where circuit operating voltages are well below the required electrostatic discharge protection level and integrated diodes that have suitable breakdown voltages are often unavailable.

A further complication in higher voltage applications relates to the concomitant increase in the amount of energy that must be dissipated in the diode with increasing voltage.

In view of the inherent complications in the art, high voltage integrated circuits have not yet reached maturity.

Over the years, since the invention of integrated circuits, a greater number of high voltage circuit functions have been integrated into the silicon integrated circuit. Prior to the advent of this incorporation, the high voltage circuit functions were implemented with discrete components or designed into hybrid modules. These two technologies proved to be impractical from a cost effectiveness point of view for a given circuit function.

In principle, a simple spark gap could be used to provide protection for high voltage integrated circuits especially as it can hold off high voltages in either direction. A spark gap can be made to operate at less than 1000V. The two problems to be solved are how to safely absorb the increased energy dissipation and how to reduce the voltage.

The present invention seeks to overcome the limitations in the art with respect to voltage handling capacity and thermal dissipation.

By employing the technology of the present invention, it is possible to reduce the dissipation problem by making the active part of the spark gap large so that the heat is dissipated over a larger area, causing a much smaller rise in temperature. However, without other measures the size of the device needed would be inconveniently large.

The present invention solves this problem by making use of poly silicon as the spark gap material so that the dissipation problem is greatly reduced. The higher melting point of poly silicon suppresses open circuit formation and reduces the probability of conductive paths being formed out of evaporated material.

SUMMARY OF THE INVENTION

In one object of one embodiment of the present invention, there is provided a spark gap assembly suitable for use in an integrated circuit, comprising:
a first at least partially conductive electrode;
a second at least partially conductive electrode, the first electrode and the second electrode in spaced relation;
a first conductive layer overlying the first electrode and a second conductive layer overlying the second electrode;
a spark gap formed between the first conductive layer and the second conductive layer;
a plurality of discrete resistors in electrical communication with each layer proximate the gap; whereby the resistors absorb energy and limit the energy dissipated in a spark discharge in the gap.

The discrete resistors may comprise any suitable material capable of functioning as a resistor. Suitable examples include poly silicon, refractory metal, high melting point alloys.

According to another object of one embodiment of the present invention, there is provided a spark gap assembly suitable for use in an integrated circuit, comprising:
a hermetically sealed package, the package containing:
a first at least partially conductive electrode insulated portion having a conductive portion and an insulated portion;
a second at least partially conductive electrode having a conductive portion and an insulated portion, the first electrode and the second electrode in spaced relation and defining a spark gap therebetween; and
a plurality of resistors in electrical communication with each the electrode and the spark gap, whereby electrical current between electrodes is divided by the resistors for reducing the thermal energy dissipated in a spark discharged in the gap.

As alternatives, a metal with a higher melting point than aluminum instead of poly silicon could be used.

Any layer of poly silicon or any conductive layer with a sufficiently high melting point could be used for the spark gap structure.

The inventions disclosed herein may be applied to any integrated circuit which requires protection at a high voltage or to any sort of integrated circuit, particularly as it uses only conductive layers that are common to any integrated circuit (e.g. MOS, III/V, silicon carbide, bipolar).

It is possible that the application may be found outside integrated circuits, where very finely defined spark gaps are needed.

Micro mechanical integrated circuits is also emerging technology that is due to discover ESD damage. These tiny components will be very susceptible to ESD, but in many cases there will be no electronic circuitry to provide protection diodes. It would be simple and cost effective to integrate spark gaps into these devices and, if necessary, introduce an special gas at the required pressure.

Having thus generally described the invention, reference will now be made to the accompanying drawings illustrating preferred embodiments.

BRIEF DESCRIPTION OF THE DRAWINGS

FIG. 1 is a schematic illustration of a prior art spark gap assembly;

FIG. 2 is a section along line 2–2 of FIG. 1;

FIG. 3 is a schematic illustration of a further embodiment of the present invention;

FIG. 4 is a section along line 4–4 of FIG. 3;

FIG. 5 is a schematic illustration of a further embodiment of the present invention; and FIG. 6 is a section along line 6–6 of FIG. 5.

Similar numerals employed in the specification denote similar elements.

DETAILED DESCRIPTION OF THE PREFERRED EMBODIMENTS

Referring now to the drawings, FIGS. 1 and 2 illustrate a spark gap assembly, globally denoted by numeral 10 which is known in the art. The arrangement includes two isolated metal conductors 12 and 14 in spaced relation forming a spark gap 16.

FIG. 3 illustrates a first embodiment of the spark gap assembly 10' according to one embodiment. In this arrangement, the electrodes comprise a pair of isolated metal electrodes 18 and 20 which are isolated from one another by spark gap 16. The arrangement 10' also includes a poly silicon layer under each bonding pad 22. This replaces Al metal by poly silicon contact to metals at the bonding pad 22 to avoid small contacts between metal and aluminum, which may be damaged by temperature and current.

Referring now to FIG. 5, shown is a further embodiment of the spark gap assembly of the present invention. The assembly is denoted by numeral 10" and includes electrodes 18 and 20. Each of the electrodes further includes an array of ballast resistors 24 and 26 extending integrally therefrom. The assembly 10" is very similar to the arrangement in FIG. 3. The spark gap 16 itself is formed between the long strips of poly silicon connected to electrodes 18 and 20 by the resistors 24 and 26. The resistors 24 and 26 distribute current generated during an electrostatic discharge along the strips. When an electrostatic discharge occurs between the two electrodes 18 and 20, the spark gap 16 breaks down by avalanche ionization. The voltage is divided across the resistors 24 and 26 which absorb energy and limit the energy dissipation in the spark discharge. The resistors 24, 26 help spread the current evenly along the spark gap 16. In terms of the breakdown voltage for the spark gap, the gas species, gap length and pressure can be chosen to produce the required voltage in accordance with Pascal's law. Suitable gases include the noble gases. Typically, low pressures would be used to attain low breakdown voltages in accordance with Panchen's law.

By providing the resistor arrays 24 and 26, there has been significant progress with respect to heating and erosion in the spark gap 16.

Although FIGS. 5 and 6 illustrate a plurality of resistors in a laterally spaced apart relation, it will be appreciated that other arrangements are possible and will be known to those skilled in the art. Furthermore, regarding the material for the resistors, any material capable of limiting electrical current may be employed. Suitable examples include poly silicon, refractory metals, nichrome and sichrome.

The metallization is kept well away from the spark gap because of the high temperatures generated by the discharge. One option is to remove metallization from the device by putting poly silicon under the bonding pad so that no metal/poly silicon contact is needed on the device (see FIG. 3). Heating and erosion of the spark gap is minimised by making the spark gap out of massive parallel stripes of poly silicon instead of the customary fine point, or points. The current is limited and spread evenly along the spark gap by building ballast resistors into the structure (FIG. 5).

Regardless of the materials used or the spark gap width (above about 1 micron), the breakdown voltage tends to remain at about 800V. This is because a certain minimum mean free path is required to initiate ionisation, and further reductions in the gap simply cause the discharge current to move further back on the conductor, maintaining an essentially constant spark length. It has long been known that the breakdown voltage of a spark gap will fall with reduced gas pressure in the gap and our experimental measurements show a reduction in breakdown voltage to about 400V in a commercial ceramic package due to the reduced pressure in the cavity caused by cooling from the high lid sealing temperature.

Lower break down voltage could be achieved by deliberately controlling the cavity pressure. A still lower break down voltage may be achieved by introducing special gases into the cavity (for example, noble gases). A device embodying the key structural features is shown in FIG. 5.

FIG. 5, by way of example, shows a practical spark gap where poly silicon is incorporated under the bonding pads and connection to the spark gap is made by a continuous run of poly silicon. Aluminium metallization is used only on the bonding pad to connect the bonding wire through a large contact window to the poly silicon. The spark gap itself is formed between two long stripes of poly silicon connected to the bonding pads by a set of parallel resistors designed to distribute the current evenly along the contact strips. When ESD occurs between the two pads, the spark gap breaks down by avalanche ionization. The voltage is divided across the two resistors, which absorb energy and limit the energy dissipated in the spark discharge. The resistors also help spread the current evenly along the spark gap. The gas species and pressure can be chosen to give the required spark gap break down voltage.

Important design variables are the pressure and species of the gas in the hermetic package.

Other Applications

The ideas outlined in this application can be applied to any silicon integrated circuit that requires protection at a high voltage. It can also be applied to any sort of integrated circuit, particularly as it uses only conductive layers that are common to any integrated circuit (e.g. MOS, III/V, silicon carbide, bipolar).

It is possible that the application may be found outside integrated circuits, where very finely defined spark gaps are needed. Micro mechanical integrated circuits is an emerging technology that is due to discover ESD damage. These tiny components will be very susceptible to ESD, but in many cases there will be no electronic circuitry to provide protection diodes. It would be simple and cost effective to integrate spark gaps into these devices and, if necessary, introduce an special gas at the required pressure.

Although embodiments of the invention have been described above, it is not limited thereto and it will be apparent to those skilled in the art that numerous modifications form part of the present invention insofar as they do not depart from the spirit, nature and scope of the claimed and described invention.

I claim:

1. A spark gap assembly suitable for use in an integrated circuit, comprising:

a first at least partially conductive electrode;

a second at least partially conductive electrode, said first electrode and said second electrode in spaced relation;

a first conductive layer overlying said first electrode and a second conductive layer overlying said second electrode;

a spark gap formed between said first conductive layer and said second conductive layer;

a plurality of discrete resistors in electrical communication with each layer proximate said gap; whereby said resistors absorb energy and limit the energy dissipated in a spark discharge in said gap.

2. The spark gap assembly as set forth in claim 1, wherein each electrode comprises aluminum.

3. The spark gap assembly as set forth in claim 1, wherein each conductive layer comprises poly silicon.

4. The spark gap assembly as set forth in claim 1, wherein said plurality of resistors are arranged in a parallel relationship.

5. The spark gap assembly as set forth in claim 1, in combination with an integrated circuit.

6. The spark gap assembly as set forth in 5, wherein said assembly and said integrated circuit is hermetically sealed.

7. A spark gap assembly suitable for use in an integrated circuit, comprising:

a hermetically sealed package, said package containing:

a first at least partially conductive electrode insulated portion having a conductive portion and an insulated portion;

a second at least partially conductive electrode having a conductive portion and an insulated portion, said first electrode and said second electrode in spaced relation and defining a spark gap therebetween; and a plurality of resistors in electrical communication with each said electrode and said spark gap, whereby electrical current between electrodes is divided by said resistors for reducing the thermal energy dissipated in a spark discharged in said gap.

8. The spark gap assembly as set forth in claim 7, wherein said package contains a noble gas for reducing breakdown voltage of said assembly.

9. The spark gap assembly as set forth in claim 7, wherein each electrode includes poly silicon and aluminum.

\* \* \* \* \*